United States Patent [19]
Butler

[11] Patent Number: 5,710,521
[45] Date of Patent: Jan. 20, 1998

[54] OUT-OF-BAND COMPENSATION FOR NON-LINEAR DEVICE

[75] Inventor: Brian K. Butler, San Diego, Calif.

[73] Assignee: Qualcomm Incorporated, San Diego, Calif.

[21] Appl. No.: 580,573

[22] Filed: Dec. 29, 1995

[51] Int. Cl.⁶ .................. H03F 3/66; H03F 1/26
[52] U.S. Cl. .................................. 330/52; 330/149
[58] Field of Search .................. 330/52, 129, 149, 330/306; 455/114

[56] References Cited

U.S. PATENT DOCUMENTS 5,166,634  11/1992  Narahashi et al. ............ 330/52 X

FOREIGN PATENT DOCUMENTS 0067091   12/1982  European Pat. Off. ......... H03F 1/32
2150383    6/1985  United Kingdom ........... H04B 9/00
9222157   12/1992  WIPO .......................... H04J 13/00

OTHER PUBLICATIONS

EPO, Patent Abstracts of Japan, Application No. 60025625, Publication No. 61186035 published Aug. 19, 1986 of Fijitsu Ltd.

*Primary Examiner*—Steven Mottola
*Attorney, Agent, or Firm*—Russell B. Miller; Gregory D. Ogrod

[57] ABSTRACT

A system for substantially eliminating nonlinear distortion, such as intermodulation products, introduced when a signal is processed by a nonlinear device. The system adds an out-of-band signal to an input signal to produce a combined signal having a power that substantially equals a nominal operating point power for a nonlinear device. Preferably, the instantaneous power of the out-of-band signal is adjusted by an automatic gain amplifier. The combined signal is input to the nonlinear device to produce an output. A filter processes the output of the nonlinear device to recover the information content of the original signal after processing by the nonlinear device. For example, if the nonlinear device is a power amplifier, the filtered output is an amplification of the input signal.

15 Claims, 5 Drawing Sheets

OUT-OF-BAND COMPENSATION FOR NONLINEAR DEVICE

BACKGROUND OF THE INVENTION

I. Field of the Invention

The present invention relates generally to the field of communication systems. More particularly, the present invention relates to reducing or eliminating nonlinearities in power amplifiers used to transmit signals.

II. Description of the Related Art

Power amplifiers in communication systems that operate at high intermodulation levels generally operate close to their saturation point. The saturation point is the point at which the amplifier's output power is no longer increasing with increasing input power. That is, after the saturation point has been reached, the output power of the power amplifier is substantially constant regardless of the input. Thus, the power amplifier exhibits a nonlinearity in its operation near the saturation point. The saturation region is also referred to as the gain compression region.

Intermodulation is a term that is used to describe the nonlinearity. For example, when a nonlinear device operates on a signal having multiple spectral components to produce an output signal, the output signal is comprised of spectral components that were not present in the original input signal. Some of the components can be removed by filtering, and do not cause significant distortion. Other components, however, cannot be removed by filtering. The components that cannot be removed by filtering give rise to nonlinear distortion. These components are commonly referred to as intermodulation products.

This intermodulation causes undesirable distortion in most communication systems. For example, assume that a communication system employs code division, multiple access (CDMA) modulation. Further assume that a CDMA signal is amplified prior to transmission over a communication channel. A nonlinear power amplifier is commonly used to provide the amplification. CDMA signals transmitted in real communication systems often exhibit a non-constant envelope. A common cause is that a plurality of CDMA signals are multiplexed together to form a single multiplexed CDMA signal. Such a signal could be the result of several CDMA signals being combined onto a single carrier to form a CDMA channel, or several CDMA channels at different frequencies being combined into a signal for transmission. The multiplexed CDMA signal exhibits a non-constant envelope. Other well known causes give rise to the non-constant envelope phenomenon. As a result, the input power to the nonlinear amplifier traverses the input power range of the nonlinear power amplifier. Because, the nonlinear amplifier is nonlinear across its input range, the output signal exhibits undesirable nonlinear effects, such as intermodulation products.

CDMA is a spread-spectrum modulation technique that is commonly used in communication systems that provide service for a large number of communications system users. Spread spectrum techniques such as CDMA provide significant advantages over other modulation schemes, especially when providing service for a large number of communication system users. In a CDMA system, multiple signals intended for one or more users are transmitted over a single frequency band, or CDMA channel, through the proper assignment of orthogonal channelizing codes, such as Walsh codes, or through the assignment of uncorrelated spreading codes to each user. The use of CDMA techniques in a multiple access communications system is disclosed in the teachings of U.S. Pat. No. 4,901,307, which issued Feb. 13, 1990 under the title "Spread Spectrum Multiple Access Communication System Using Satellite Or Terrestrial Repeaters," and U.S. patent application Ser. No. 08/368,570, filed Jan. 4, 1995 under the title "Method And Apparatus For Using Full Spectrum Transmitted Power In A Spread Spectrum Communication System For Tracking Individual Recipient Phase Time And Energy," which are both assigned to the assignee of the present invention, and are incorporated herein by reference.

Nonlinear distortion, such as that caused by intermodulation, is an undesirable effect which can destroy the information content of a signal in a communication system. Thus, what is required is a system for reducing or eliminating nonlinear distortion such as that represented by intermodulation products.

SUMMARY OF THE INVENTION

The present invention is a system and method for substantially eliminating the harmful effects of signal distortion caused by nonlinear devices. The system combines a signal to be amplified with an out-of-band signal. The out-of-band signal is regulated such that when the out-of-band signal is combined with the signal to be amplified (to provide one combined signal). The combined signal has a power that is substantially equal to a predetermined nominal operating point for the nonlinear device. The nonlinear device operates on the combined signal to produce an output signal. A filter operates on the output signal to remove the out-of-band signal. Nonlinear distortion is substantially eliminated because the nonlinear device always operates on a signal that has been preprocessed to operate at the predetermined nominal operating point for the nonlinear device. Because the nonlinear device sees a signal having a substantially constant power, the nonlinear device outputs a substantially constant output. Importantly, the output has a linear characteristic. Thus, the present invention has the desired effect of linearizing the output of a nonlinear device.

Without the present invention, the output of the nonlinear device would exhibit severe nonlinear distortion as the input power traverses the input power range of the nonlinear amplifier. With the present invention, however, the input power is maintained at a constant level, the predetermined nominal operating point. By so doing, the power amplifier outputs a constant output power and constant phase. Thus, there is no distortion. The information content of the signal input to the present invention is recovered by removing the out-of-band signal.

Further features and advantages of the present invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the digit(s) to the left of the two rightmost digits in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

The present invention is directed to a system and method for substantially eliminating nonlinear distortion, such as intermodulation products, introduced when a signal is processed by a nonlinear device. The system adds an out-of-band signal to an input signal to produce a combined signal having a power that substantially equals a nominal operating point power for a nonlinear device. The combined signal is input to the nonlinear device to produce an output. A filter processes the output of the nonlinear device to recover the information content of the original signal after processing by the nonlinear device. For example, if the nonlinear device is a power amplifier, the filtered output is an amplification of the input signal.

Figure 2:
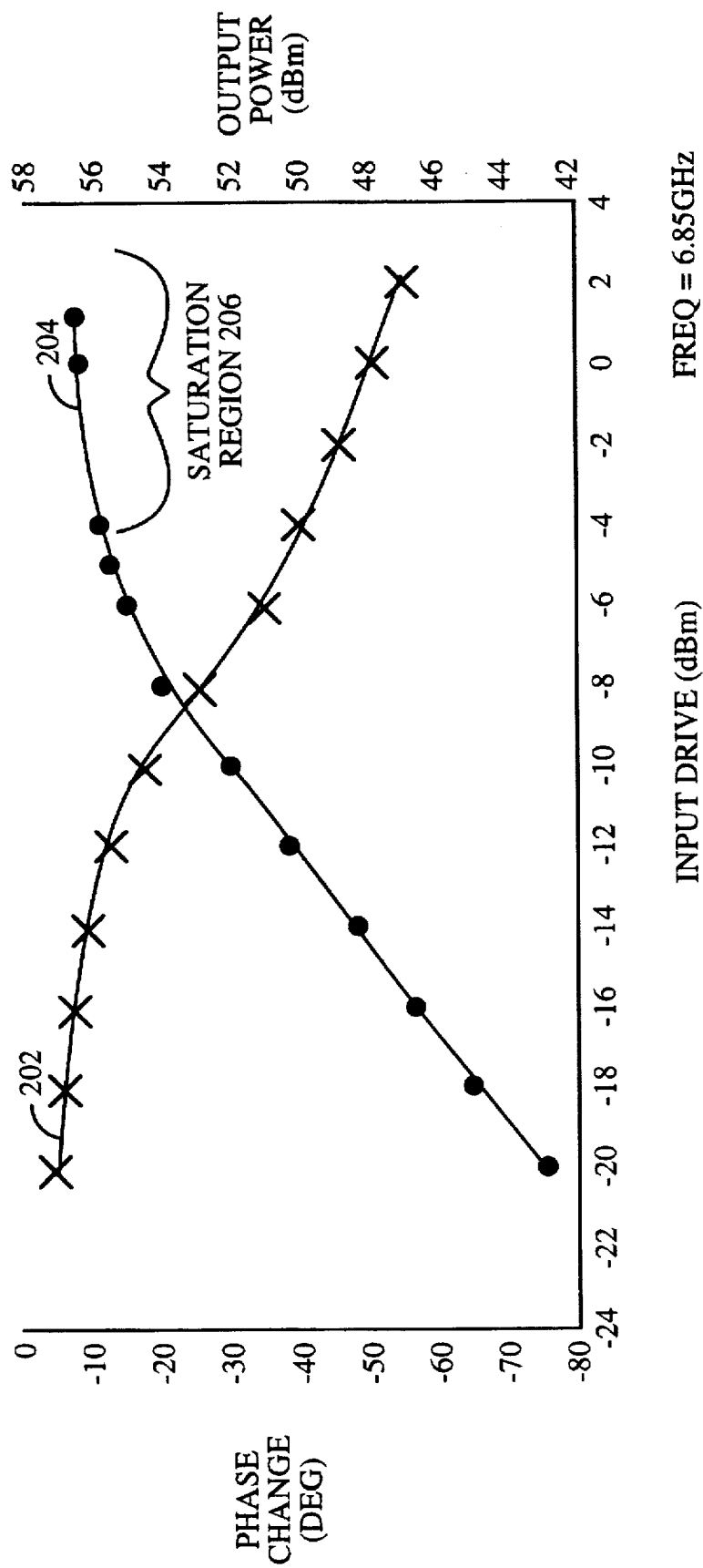
FIG. 2 illustrates the magnitude and phase outputs of a conventional power amplifier.

In FIG. 2, the output power and phase characteristics of a conventional nonlinear power amplifier are illustrated. Curve 202 illustrates the phase of the output versus the phase of an input sine wave of a conventional nonlinear power amplifier. Such a curve is commonly referred to as an "AM-PM" plot. Curve 204 illustrates the magnitude of the output power versus the input power for a sinusoidal input for a conventional nonlinear power amplifier. Such a curve is commonly referred to as an "AM-AM" plot. Curve 202 illustrates that the phase of the output power versus input power is non-constant over most of the operating region of a conventional nonlinear power amplifier. Similarly, curve 204 illustrates that the magnitude of the power output is nonlinear near a saturation region 206. In the case of the power amplifier illustrated in FIG. 2, the saturation region 206 starts at about −4 dBm. It would be apparent to any person skilled in the art that the saturation region can extend over a different range of values.

The preferred embodiment of the present invention substantially reduces nonlinear operation by providing a nonlinear device with a signal having a substantially constant signal envelope. That is, the instantaneous power of the input is maintained at a substantially constant value. The value chosen is a predetermined nominal operating point. In the preferred embodiment of the present invention, the predetermined nominal operating point is chosen to be the start of the saturation region 206. It would be apparent to any person skilled in the art that other nominal operating points can be chosen.

Figure 1:
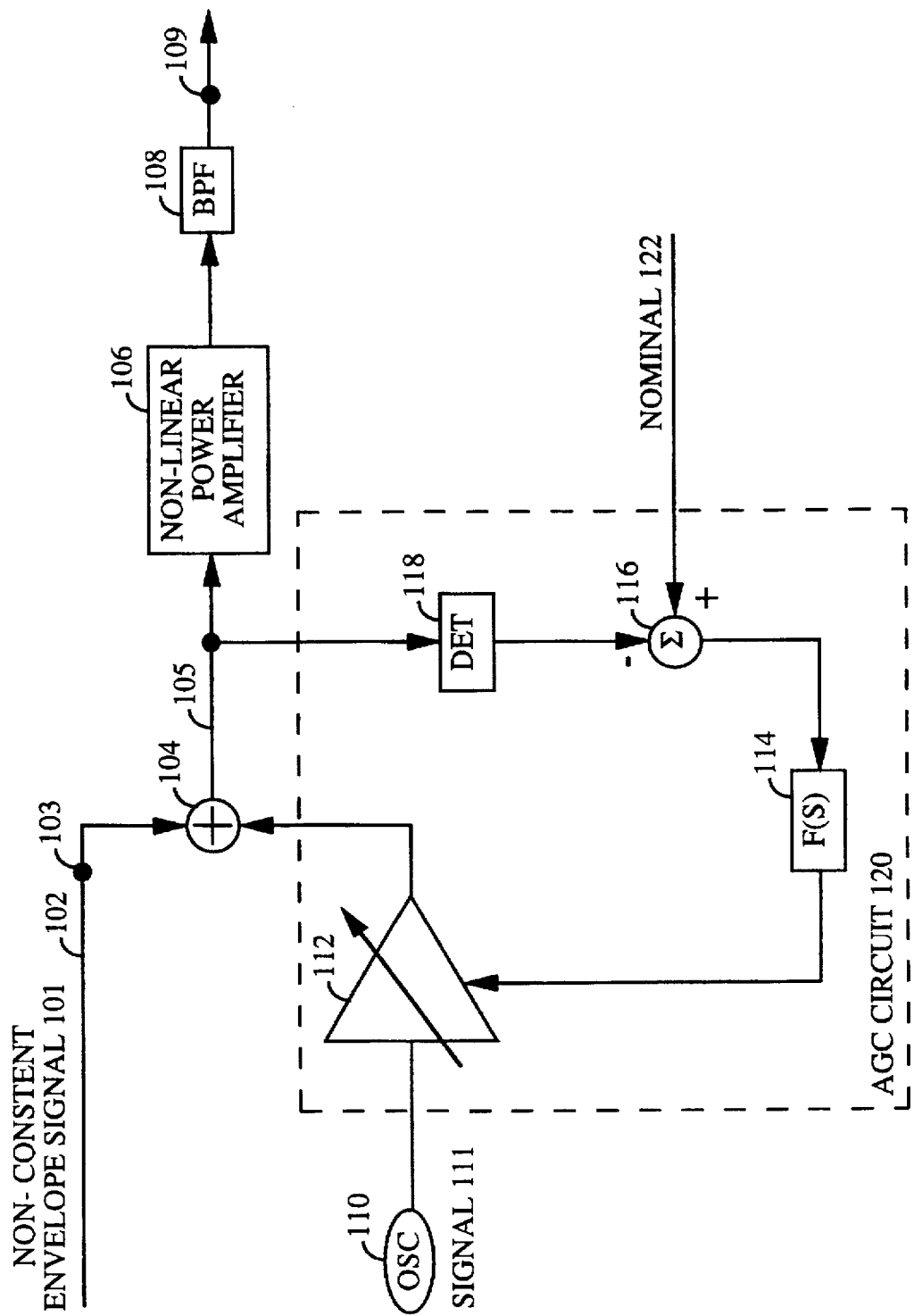
FIG. 1 is a system designed according to a preferred embodiment of the present invention.

FIG. 1 illustrates a system designed according to a preferred embodiment of the present invention. The system comprises generator (oscillator) 110, an automatic gain control (AGC) circuit 120, a combiner 104, and a bandpass filter (BPF) 108. The AGC circuit 120 comprises a variable gain amplifier 112, a power detector 118, an adder 116, and a filter 114.

In operation, a system designed according to a preferred embodiment of the present invention inputs a non-constant envelope input signal 101 over line 102. An example of a non-constant envelope signal is a CDMA signal that has been combined with other CDMA signals. The combiner 104 combines the input signal 101 with an out-of-band signal 111 that has been gain adjusted by variable gain amplifier 112. The output of the combiner 104 is a combined signal 105. The out-of-band signal 111 is preferably a continuous wave (CW) tone generated by the oscillator 110. The combined signal 105 is input to a nonlinear power amplifier 106. The nonlinear power amplifier 106 amplifies the combined signal 105. A band pass filter (BPF) 108 filters the output of the nonlinear power amplifier 106 to remove the out-of-band signal 111 that was added to the input signal 101. The resultant signal is an amplified version of the input signal 101. The amplified signal does not suffer from nonlinear distortion because the input power of the nonlinear amplifier 106 is held substantially constant.

In the preferred embodiment of the present invention, the input power to the nonlinear amplifier 106 is held substantially constant in the following manner. The AGC circuit 120 is used to adjust the instantaneous power of the out-of-band signal 111. The AGC circuit 120 controls the gain of the out-of-band signal 111 such that the power of the signal that results from the combination of the out-of-band signal 111 with the input signal 101 is substantially constant.

Referring to FIG. 1, the operation of AGC circuit 120 is described. Combiner 104 combines the out-of-band signal 111 with the input signal 101 to produce a combined signal 105. The combined signal 105 is input to nonlinear amplifier 106. The combined signal is also input to the AGC circuit 120.

The AGC circuit 120 first detects the instantaneous power of the combined signal 105. In the preferred embodiment of the present invention, the detector 118 detects the instantaneous power of the combined signal 105. For example, the detector may detect the instantaneous value of the envelope of the combined signal 105. The output of detector 118 is a voltage proportional to detected power in dBm.

The detected instantaneous power is subtracted from, or the negative of the detected power is summed with, a value corresponding to the value of the predetermined nominal operating point. This value is designated nominal value 122 in FIG. 1. The output of adder 116 is a power difference signal. The power difference signal is input to filter 114.

Filter 114 tracks the variation of the instantaneous power of the combined signal 105 from the predetermined nominal operating point. In the preferred embodiment of the present invention, filter 114 is an integrating filter. The output of filter 114 represents the amount by which the power of the combined signal differs from the nominal value 122. Because filter 114 is an integrating filter it is configured to store or accumulate input values, such as by using a memory circuit. Thus, filter 114 tracks the incremental difference between the power of the combined signal 105 and the nominal value 122. The output of filter 114 controls variable gain amplifier 112.

Variable gain amplifier 112 adjusts out-of-band signal 111 such that the instantaneous power of the combined signal 105 is substantially equal to the nominal operating point. The adjustments must be made rapidly enough to track the variation in the non-constant envelope. For example, in a single channel CDMA signal having a 1 MHz bandwidth, a closed loop time constant of 0.2 microseconds or less is generally required. In the case of a multiplexed CDMA signal (a CDMA signal having a plurality of CDMA signals multiplexed into a single multiplexed CDMA signal), the envelope varies as a function of the bandwidth of the multiplexed CDMA signal. Thus, for a single CDMA signal of 1 MHz bandwidth, the AGC 120 must update in much less than a microsecond. In the preferred embodiment of the present invention, the AGC 120 responds in less than 200 nanoseconds. Because the CDMA signals in the preferred embodiment are modulated onto carriers with frequencies greater than 1 GHz, 200 nanoseconds provides sufficient duration for at least 200 cycles of the carrier signal in which detector 118 can measure instantaneous power.

Figure 3:
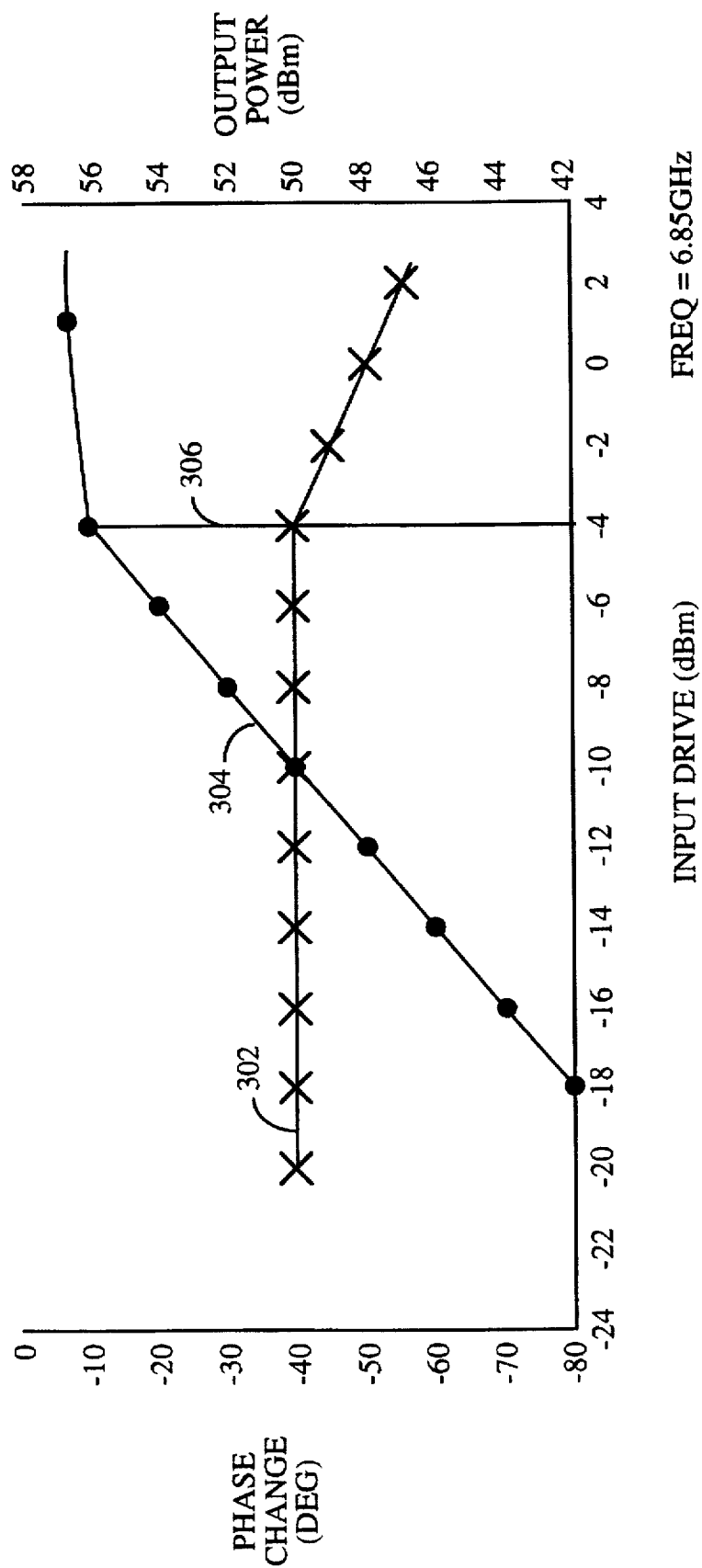
FIG. 3 illustrates the magnitude and phase outputs of a system designed according to a preferred embodiment of the present invention.

Referring to FIG. 3, the "AM-AM" and "AM-PM" plots for a system designed according to a preferred embodiment of the present invention are described. As previously described, in operation, the combined signal 105, i.e., the input to the nonlinear power amplifier 106, has a substantially constant instantaneous power. The instantaneous power level is substantially equal to the nominal operating point. In the preferred embodiment, the nominal operating point for the nonlinear power amplifier 106 was chosen to be −4 dBm. Thus, the instantaneous power of the combined signal is maintained substantially equal to −4 dBm. As a result, the phase of the output of nonlinear amplifier 106 has a substantially constant value. The output phase has a value that is substantially equal to that produced by a nonlinear power amplifier 106 having an input substantially equal to the nominal operating point. In the preferred embodiment, the constant phase value is represented by line 302. As can be seen in FIG. 3, line 302 has a value of −40 degrees. This is the value of the output phase for the nominal operating point −4 dBm.

FIG. 3 also illustrates that a system designed according to a preferred embodiment linearizes the power gain of nonlinear amplifier 106. Curve 304 illustrates the relationship between the power at a point 103 in FIG. 1 ($P_A$) and a point 109 in FIG. 1 ($P_B$). That is, the output of filter 108 is an amplified version of input signal 102. Not only is the input signal 102 amplified, but, as shown in curve 304, the input signal 102 is amplified substantially linearly.

Thus, a system designed according to a preferred embodiment of the present invention linearizes the magnitude of the output of nonlinear power amplifier 106 and forces the phase output to a substantially constant value. Thus, a system designed according to the preferred embodiment of the present invention substantially eliminates or reduces the harmful effects caused by nonlinear distortion, such as intermodulation products.

Figure 4:
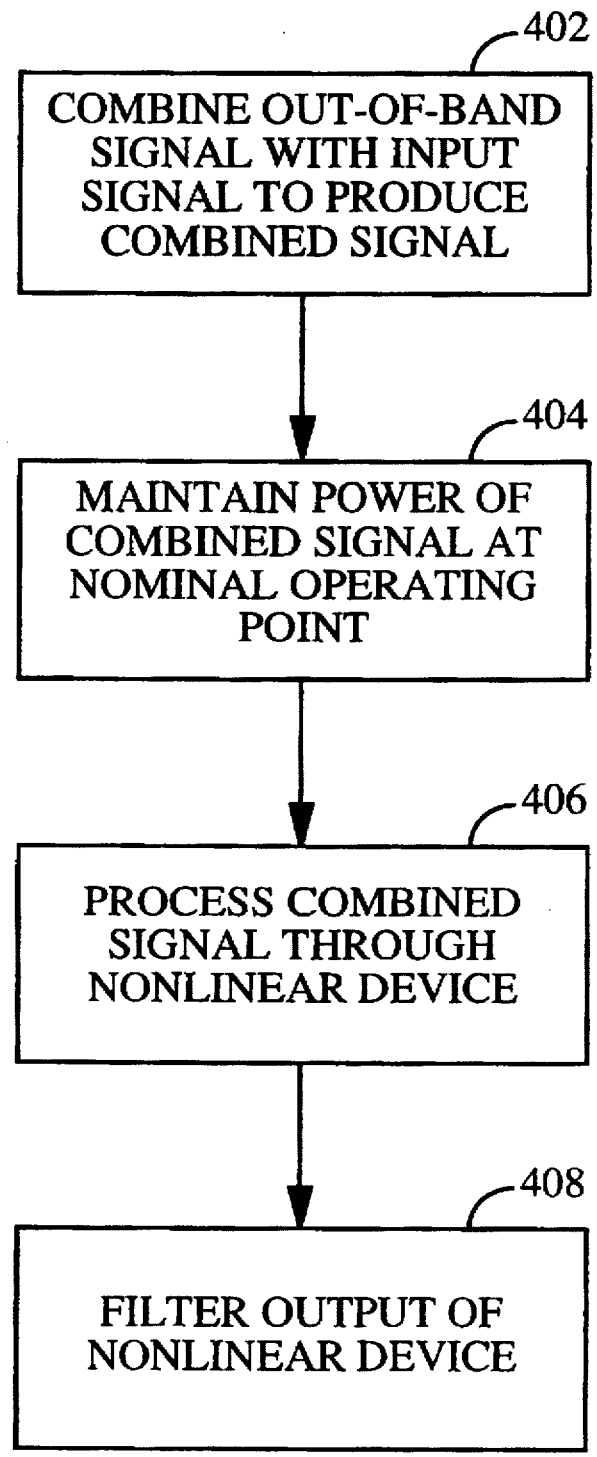
FIG. 4 illustrates a method according to a preferred embodiment of the present invention.

FIG. 4 illustrates a method for substantially eliminating nonlinear distortion, such as intermodulation products, caused by a nonlinear power amplifier 106. In a step 402, an out-of-band signal is combined with an input signal. The combination forms a combined signal having an instantaneous power substantially equivalent to a predetermined nominal operating point. In a step 404, the power of the combined signal is maintained at the predetermined nominal operating point. Step 404 is described further below with reference to FIG. 5.

In a step 406, the combined signal is processed through, or by, a nonlinear device. In the preferred embodiment, the nonlinear device is a nonlinear power amplifier such as nonlinear power amplifier 106. As described above, forcing the input of the nonlinear device to be substantially equal to the predetermined nominal operating point results in substantial linearization of the nonlinear device's operation. As a result, the method substantially reduces or eliminates harmful nonlinear distortion present in conventional nonlinear devices.

Finally, in a step 408, the output of the nonlinear device is filtered. The filtering step removes the out-of-band signal. After filtering, an amplified version of the input signal remains. Because of the linearizing of the operation of the nonlinear device, the amplified version of the input signal is not distorted by the nonlinearities of the nonlinear device.

Figure 5:
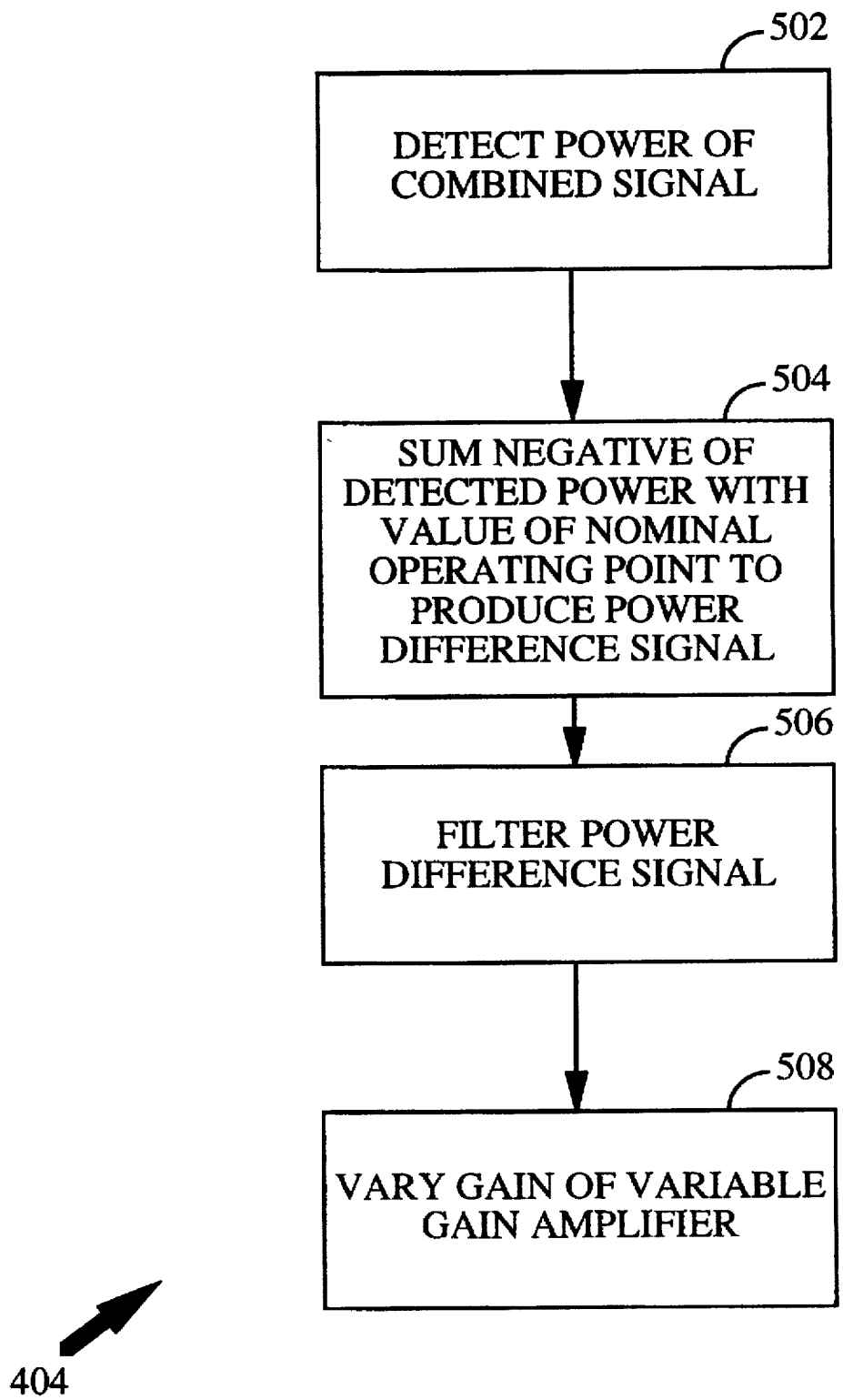
FIG. 5 illustrates a method for maintaining a signal at a predetermined nominal operating point.

Referring to FIG. 5, step 404 is further described. In a step 502, the instantaneous power of the combined signal is detected. In a step 504, the detected instantaneous power is compared to the nominal operating point. In the preferred embodiment, the comparison step is essentially a subtraction operation. That is, the detected instantaneous power is subtracted from the nominal operating point, or the negative of the detected instantaneous power is summed with the nominal operating point. The result of the subtraction is a power difference signal. The power difference signal is representative of how much power must be added to the combined signal to force its instantaneous power to be equal to the nominal operating point. In a step 506, the power difference signal is then filtered. In the preferred embodiment, the filtering is performed by an integration process. Thus, the filtering tracks by how much the out-of-band signal must be varied to supply sufficient power to the input signal such that a combination of the out-of-band signal and the input signal is substantially equal to the nominal operating point. Finally, in a step 508, the gain of a variable gain amplifier is varied to provide the required gain to the out-of-band signal.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What I claim as my invention is:

1. A system for reducing nonlinear distortion in a nonlinear device which has a nominal operating point above which it reaches saturation for increased levels of power in an input signal, comprising:

a nonlinear device input;

a signal source to produce a variable magnitude out-of-band signal;

a combiner connected in series with said nonlinear device input and to said signal source to combine said out-of-band signal with said input signal to produce a combined signal for input to said nonlinear device, with the power of said combined signal being maintained at a predetermined level substantially equal to said nominal operating point for said nonlinear device; and a filter coupled to an output of said nonlinear device to remove said out-of-band signal from said output of said nonlinear device.

2. The system of claim 1, further comprising:

an automatic gain control (AGC) circuit coupled to said combiner to maintain the power of said combined signal at a level substantially equal to said nominal operating point.

3. The system of claim 2, wherein said AGC circuit comprises:

a detector coupled to said combiner to detect the power of said combined signal and produce a detected power signal;

an adder coupled to an output of said detector to add the negative of said detected power signal with a signal having a value substantially equal to said nominal operating point to produce a power difference signal;

a second filter coupled to an output of said adder to filter said power difference signal to generate a gain update signal; and a variable gain amplifier coupled to an output of said second filter to amplify said out-of-band signal according to said gain update signal to cause said combined signal to have a power substantially equal to said nominal operating point.

4. The system of claim 1, wherein said signal source is an oscillator and said out-of-band signal is a continuous wave signal.

5. The system of claim 1, wherein said nonlinear device is a nonlinear power amplifier.

6. The system of claim 3, wherein said second filter comprises an integrating filter.

7. A method, for reducing nonlinear distortion in a nonlinear device which has a nominal operating point above which it reaches saturation for increased levels of power in an input signal, comprising the steps of:

(a) combining an out-of-band signal with an input signal to produce a combined signal having a power substantially equal to a nominal linear operating point for a nonlinear device;

(b) maintaining the power of said combined signal at a level substantially equal to said nominal operating point;

(c) processing said combined signal in said nonlinear device to produce an output; and (d) filtering said output to remove said out-of-band signal.

8. The method of claim 7, wherein step (b) further comprises the steps of:

(e) detecting the power of said combined signal to produce a detected power signal;

(f) summing the negative of said detected power signal with a signal having a power substantially equal to said nominal linear operating point to produce a power difference signal;

(g) filtering said power difference signal to generate a gain update signal; and (h) varying the gain of said out-of-band signal in accordance with said gain update signal such that the power of said combined signal is substantially equal to said nominal linear operating point.

9. The method of claim 8, wherein step (d) comprises band pass filtering.

10. The method of claim 9, wherein step (g) comprises an integration.

11. Apparatus for reducing nonlinear distortion introduced when a signal is processed by a nonlinear device which has a nominal operating point above which it reaches saturation for increased levels of power in an input signal, comprising:

a nonlinear device input;

a signal source generating a variable magnitude out-of-band signal, with respect to said input signal;

a combiner connected in series with said nonlinear device input and to said signal source to receive and combine said out-of-band signal with said input signal to produce a combined signal for input to said nonlinear device;

an automatic gain control (AGC) circuit coupled to said combiner to maintain the power of said combined signal within a predetermined substantially constant power magnitude envelope which is less than or equal to said nominal operating point for said nonlinear device, comprising:

a detector coupled to said combiner to detect the power of said combined signal and produce a detected power signal;

an adder coupled to an output of said detector to add the negative of said detected power signal with a signal having a value substantially equal to said nominal operating point to produce a power difference signal;

a second filter coupled to an output of said adder to filter said power difference signal to generate a gain update signal; and a variable gain amplifier coupled to an output of said second filter to amplify said out-of-band signal according to said gain update signal to cause said combined signal to have a power substantially equal to said nominal operating point; and a filter coupled to an output of said nonlinear device to remove said out-of-band signal from said output of said nonlinear device.

12. The system of claim 1 wherein said predetermined level of said combined signal provides a substantially constant signal envelope for said combined signal.

13. The system of claim 1 wherein said predetermined level of said combined signal comprises a substantially constant value of an instantaneous power level for the input to said nonlinear device.

14. The method of claim 7 wherein the step of maintaining the power of said combined signal comprises the step of maintaining a substantially constant signal envelope for said combined signal.

15. The method of claim 7 wherein the step of maintaining the power of said combined signal comprises the step of maintaining a substantially constant value of an instantaneous power level for the input to said nonlinear device.

* * * * *